(12) United States Patent
Zhong et al.

(10) Patent No.: US 11,355,675 B2
(45) Date of Patent: Jun. 7, 2022

(54) WAVELENGTH CONVERTING MATERIAL, AND LIGHT EMITTING DEVICE

(71) Applicant: Lextar Electronics Corporation, Hsinchu (TW)

(72) Inventors: Chang-Zhi Zhong, Hsinchu (TW); Hung-Chun Tong, Hsinchu (TW); Yu-Chun Lee, Hsinchu (TW); Tzong-Liang Tsai, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 443 days.

(21) Appl. No.: 16/687,634

(22) Filed: Nov. 18, 2019

(65) Prior Publication Data

US 2020/0373467 A1 Nov. 26, 2020

(30) Foreign Application Priority Data

May 21, 2019 (TW) ................................. 108117555

(51) Int. Cl.
*C09K 11/02* (2006.01)
*C09K 11/88* (2006.01)
(Continued)

(52) U.S. Cl.
CPC .......... *H01L 33/504* (2013.01); *C09K 11/025* (2013.01); *C09K 11/883* (2013.01);
(Continued)

(58) Field of Classification Search
CPC ...... B82Y 20/00; C09K 11/646; C09K 11/025
See application file for complete search history.

(56) References Cited

U.S. PATENT DOCUMENTS

| | | | |
|---|---|---|---|
| 2004/0126072 A1* | 7/2004 | Hoon Lee | G02B 6/1225 385/27 |
| 2011/0135571 A1* | 6/2011 | Lin | A61P 35/00 424/490 |

(Continued)

FOREIGN PATENT DOCUMENTS

| | | |
|---|---|---|
| CN | 102531580 B | 1/2014 |
| CN | 107541203 A | 1/2018 |

(Continued)

*Primary Examiner* — Andrew J Coughlin
(74) *Attorney, Agent, or Firm* — CKC & Partners Co., LLC (57) ABSTRACT

A wavelength converting material includes a luminous core and a first protective layer. The first protective layer covers the luminous core, in which the first protective layer includes silicon dioxide, and in silicon atoms of the silicon dioxide, the silicon atom of the zeroth configuration ($Q^0$) does not connect with any siloxy group, and the silicon atom of the first configuration ($Q^1$) connects with one siloxy group, and the silicon atom of the second configuration ($Q^2$) connects with two siloxy groups, and the silicon atom of the third configuration ($Q^3$) connects with three siloxy groups, and the silicon atom of the fourth configuration ($Q^4$) connects with four siloxy groups, in which a total amount of the silicon atoms of the third configuration and the fourth configuration is greater than a total amount of the silicon atoms of the zeroth configuration, the first configuration and the second configuration.

20 Claims, 7 Drawing Sheets

(51) Int. Cl.
- *H01L 33/50* (2010.01)
- *H01L 33/56* (2010.01)
- *H01L 33/44* (2010.01)
- *H01L 33/06* (2010.01)
- *H01L 51/00* (2006.01)

(52) U.S. Cl.
CPC .............. *H01L 33/06* (2013.01); *H01L 33/44* (2013.01); *H01L 33/501* (2013.01); *H01L 33/502* (2013.01); *H01L 33/56* (2013.01); *H01L 51/0032* (2013.01)

(56) References Cited

U.S. PATENT DOCUMENTS

| | | | |
|---|---|---|---|
| 2014/0339499 A1* | 11/2014 | Tu | ............................ H01L 33/44 438/47 |
| 2018/0046080 A1* | 2/2018 | Suzuki | .................... G03F 7/322 |
| 2019/0181306 A1* | 6/2019 | Juang | .................... H01L 33/502 |

FOREIGN PATENT DOCUMENTS

| | | | |
|---|---|---|---|
| TW | 201132740 A | 10/2011 | |
| TW | 201610095 A | 3/2016 | |
| TW | I534241 B | 5/2016 | |
| TW | I613275 B | 2/2018 | |
| TW | I623606 B | 5/2018 | |
| TW | 201819488 A | 6/2018 | |

\* cited by examiner

WAVELENGTH CONVERTING MATERIAL, AND LIGHT EMITTING DEVICE

CROSS-REFERENCE TO RELATED APPLICATION

This application claims priority to Taiwan Application Serial Number 108117555, filed May 21, 2019, which is herein incorporated by reference.

BACKGROUND

Field of Invention

The present disclosure relates to a wavelength converting material and a light emitting device.

Description of Related Art

Quantum dots and phosphor powders are common wavelength converting materials, which are applied to light emitting diodes for absorbing light from a light emitting diode chip and emitting light of another color, and the lights are then mixed to form a desired light color. Further, the quantum dot or phosphor powder may be with the light emitting diode device to serve as a backlight of a display or a pixel of a display.

However, the quantum dot of the wavelength converting material is susceptible to destruction by oxygen and moisture, which results in reduced luminance and lifetime. Therefore, there is a need for a technical solution to reduce damage to the wavelength converting material by oxygen and moisture, thereby improving the reliability of the wavelength converting material.

SUMMARY

According to one aspect of the present disclosure, a wavelength converting material includes a luminous core and a first protective layer. The first protective layer covers the luminous core, in which the first protective layer includes silicon dioxide, and in silicon atoms of the silicon dioxide, each of the silicon atoms is one of a zeroth configuration ($Q^0$), a first configuration ($Q^1$), a second configuration ($Q^2$), a third configuration ($Q^3$) and a fourth configuration ($Q^4$), and the silicon atom of the zeroth configuration ($Q^0$) does not connect with any siloxy group, and the silicon atom of the first configuration ($Q^1$) connects with one siloxy group, and the silicon atom of the second configuration ($Q^2$) connects with two siloxy groups, and the silicon atom of the third configuration ($Q^3$) connects with three siloxy groups, and the silicon atom of the fourth configuration ($Q^4$) connects with four siloxy groups, in which a total amount of the silicon atoms of the third configuration ($Q^3$) and the fourth configuration ($Q^4$) is greater than a total amount of the silicon atoms of the zeroth configuration) ($Q^0$), the first configuration ($Q^1$) and the second configuration ($Q^2$).

According to one or more embodiments of the present disclosure, the total amount of the silicon atoms of the third configuration ($Q^3$) and the fourth configuration ($Q^4$) is greater than 80% based on a total amount of the silicon atoms of the silicon dioxide of 100%.

According to one or more embodiments of the present disclosure, in a $^{29}$Si nuclear magnetic resonance spectrum of the wavelength converting material, there are a peak of the third configuration ($Q^3$) in a range of from −95 to −105 ppm and a peak of the fourth configuration ($Q^4$) in a range of from −105 to −115 ppm.

According to one or more embodiments of the present disclosure, the luminous core includes a quantum dot material.

According to one or more embodiments of the present disclosure, a surface of the quantum dot material is subjected to a modification treatment, and the modification treatment includes a ligand exchange treatment, a microemulsification treatment, an organic material coating, an inorganic material coating, an embedding into pores of mesoporous particles or a combination thereof.

According to one or more embodiments of the present disclosure, the luminous core includes a phosphor powder material.

According to one or more embodiments of the present disclosure, a surface of the phosphor powder material is subjected to a modification treatment, and the modification treatment includes an organic material coating, an inorganic material coating or a combination thereof.

According to one or more embodiments of the present disclosure, the organic material used for coating includes poly(methyl methacrylate) (PMMA), polyethylene terephthalate (PET), polyethylene naphthalate (PEN), polystyrene (PS), polyvinylidene difluoride (PVDF), polyvinyl acetate (PVAC), polypropylene (PP), polyamide (PA), polycarbonate (PC), polyimide (PI), epoxy or silicone.

According to one or more embodiments of the present disclosure, the inorganic material used for coating includes nitride, metal oxide, silicon oxide or a combination thereof.

According to another aspect of the present disclosure, the light emitting device includes a solid state semiconductor light emitting element and an above-described wavelength converting material. The solid state semiconductor light emitting element is configured to emit a first light. The wavelength converting material absorbs a portion of the first light and emits a second light with a wavelength different from a wavelength of the first light.

BRIEF DESCRIPTION OF THE DRAWINGS

The present disclosure will be better understood from the following detailed description when read in conjunction with the drawings. It should be emphasized that, depending on the standard practice in the industry, the features are not drawn to scale and are for illustrative purposes only. In fact, the size of the feature can be arbitrarily increased or decreased for the purpose of clarity.

DETAILED DESCRIPTION

The following disclosure provides various different embodiments or examples for implementing different features of the present disclosure. Specific embodiments of components and arrangements are described below to simplify the content of the present disclosure. The embodiments are merely examples and are not intended to be limiting. For example, in the following description, a first feature formed over or above a second feature includes an embodiment in which the first feature is in direct contact with the second feature, and may also include an embodiment in which the first feature is not in direct contact with the second feature.

Further, the component symbols and/or letters in the various embodiments of the present disclosure may be repeated. This repetition is for the sake of simplicity and does not indicate a relationship between the various embodiments and/or configurations. Furthermore, in the present disclosure, a following feature formed, connected to, and/or coupled to another feature, may include an embodiment in which the features are in direct contact, and may also include an embodiment in which an additional feature is inserted to the formed features such that the features are not in direct contact. Further, for ease of description, spatially relative terms (e.g., "beneath", "below", "lower", "over", "upper", and the like) may be used herein to describe a relationship between one component or feature and another component (or components) or feature (or features). The spatially relative terms are intended to encompass different orientations of the components in use or operation.

The present disclosure provides a wavelength converting material, which has excellent luminescence lifetime and maintains good brightness during long-time luminescence.

Figure 1:
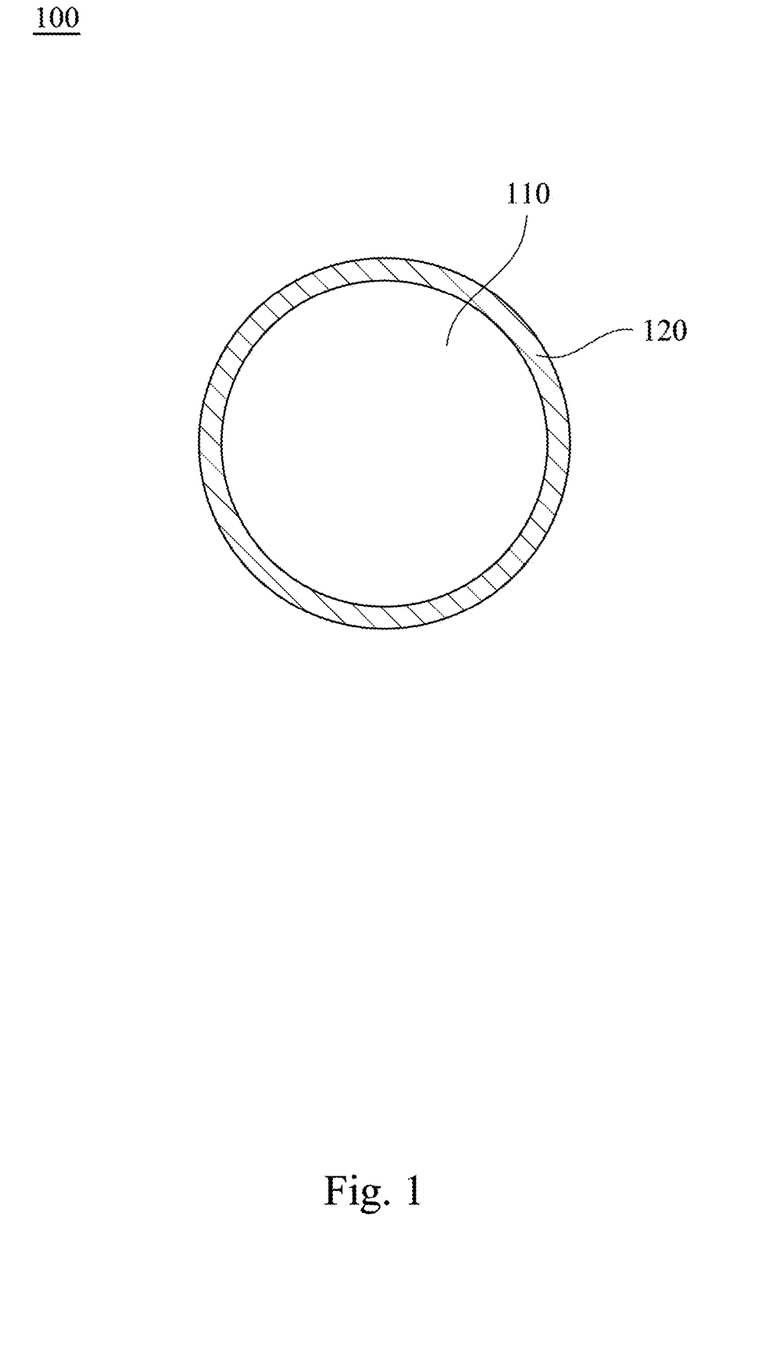
FIG. 1 is a cross-sectional view of a wavelength converting material 100 according to some embodiments of the present disclosure.

Please refer to FIG. 1, which illustrates a cross-sectional view of a wavelength converting material 100 according to some embodiments of the present disclosure. The wavelength converting material 100 includes a luminous core 110 and a first protective layer 120. The luminous core 110 includes a quantum dot material or a phosphor powder material.

The first protective layer 120 covers the luminous core 110, in which the first protective layer 120 includes silicon dioxide. It is worth noting that the silicon dioxide of the first protective layer 120 includes a plurality of silicon atoms, and each of the silicon atoms is one of a zeroth configuration ($Q^0$), a first configuration ($Q^1$), a second configuration ($Q^2$), a third configuration ($Q^3$) and a fourth configuration ($Q^4$). Specifically, the silicon atom of the zeroth configuration ($Q^0$) does not connect with any siloxy group, and the silicon atom of the first configuration ($Q^1$) connects with one siloxy group, and the silicon atom of the second configuration ($Q^2$) connects with two siloxy groups, and the silicon atom of the third configuration ($Q^3$) connects with three siloxy groups, and the silicon atom of the fourth configuration ($Q^4$) connects with four siloxy groups. That is, in $Q^n$, n is the number of other silicon atom(s) where the silicon atom connected to through the oxygen atom, and n may be 0, 1, 2, 3 or 4.

In some embodiments, the silicon dioxide of the present disclosure may be made using a silicon precursor, such as a siloxy precursor or tetraethoxysilane.

The structure of the siloxy precursor is as shown in the following structural formula (1):

Structural formula (1)

in which R is a linear or branched alkyl group, but is not limited thereto.

The structure of tetraethoxydecane is as shown in the following structural formula (2):

Structural formula (2)

For example, the silicon atom of the zeroth configuration ($Q^0$) may be a silicon precursor (e.g., above-mentioned tetraethoxysilane), which has the structure as shown in the above structural formula (2). In the structural formula (1) and the structural formula (2), the silicon atom is not connected to another silicon atom through the oxygen atom, so that the silicon atom in the structural formula (1) and the structural formula (2) is the zeroth configuration ($Q^0$).

Further, in some embodiments, the zeroth configuration ($Q^0$) may be present in an intermediate compound after hydrolysis, which includes the following structural formula (3):

Structural formula (3)

In some embodiments, the silicon atom of the first configuration ($Q^1$) may include the following structural formula (4):

Structural formula (4)

in the structural formula (4), the silicon atom denoted by $Q^1$ is the first configuration ($Q^1$), which is connected to one siloxy group. In other words, the silicon atom of the first configuration ($Q^1$) is connected to another silicon atom through one oxygen atom. The first configuration ($Q^1$) is a chain structure.

In some embodiments, the second configuration ($Q^2$), the third configuration ($Q^3$), and the fourth configuration ($Q^4$) may be as shown in structural formula (5):

Structural formula (5)

in the structural formula (5), the silicon atom denoted by $Q^2$ is the second configuration ($Q^2$), and the silicon atom denoted by $Q^3$ is the third configuration ($Q^3$), and the silicon atom denoted by $Q^4$ is the fourth configuration ($Q^4$). It is worth noting that the second configuration ($Q^2$) is a long chain structure, and the third configuration ($Q^3$) and the fourth configuration ($Q^4$) are network structures. In addition to the silicon atoms and oxygen atoms described above, other functional groups in the structure may vary depending on the precursor from which the silicon dioxide is made.

In the silicon dioxide of the first protective layer 120 of the present disclosure, a total amount of the silicon atoms of the third configuration ($Q^3$) and the fourth configuration ($Q^4$) is greater than a total amount of the silicon atoms of the zeroth configuration ($Q^0$), the first configuration ($Q^1$) and the second configuration ($Q^2$). Since the silicon dioxide of the first protective layer 120 is mainly composed of the third configuration ($Q^3$) and the fourth configuration ($Q^4$) of the network structure, the coated quantum dot material may greatly improve the tolerance.

In some embodiments, the total amount of the silicon atoms of the third configuration ($Q^3$) and the fourth configuration ($Q^4$) is greater than 80%, such as 85%, 90%, 95% or 99%, based on a total amount of the silicon atoms of the silicon dioxide of 100%. In other embodiments, an amount of the silicon atoms of the fourth configuration ($Q^4$) is greater than an amount of the silicon atoms of the third configuration ($Q^3$). In some embodiments, in the silicon dioxide, the amount of the silicon atoms of the fourth configuration ($Q^4$) is greater than a total amount of the silicon atoms of the zeroth configuration ($Q^0$), the first configuration ($Q^1$), the second configuration ($Q^2$) and the third configuration ($Q^3$).

The first protective layer of the present disclosure can protect the luminous core from damage by external factors (e.g., oxygen and moisture damage), and thus the wavelength converting material has excellent luminescence lifetime. In particular, the silicon dioxide of the first protective layer of the present disclosure has a composition of the silicon atoms of specific configurations, which can achieve a protective effect superior to a general protective layer.

In some embodiments, the luminous core 110 includes a quantum dot material. For example, the quantum dot material includes CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, SnS, SnSe, SnTe, PbS, PbSe, PbTe, SnSeS, SnSeTe, SnالسTe, PbSeS, PbSeTe, PbSTe, SnPbS, SnPbSe, SnPbTe, SnPbSSe, SnPbSeTe, SnPbSTe, $CsPbX_3$ or $Cs_4PbX_6$, in which X is chlorine, bromine, iodine or a combination thereof.

In addition, in some embodiments, in addition to being coated by the first protective layer, a surface of the quantum dot material may be further treated with other kinds of modification treatments, such as a ligand exchange treatment, microemulsification treatment, an organic material coating, an inorganic material coating, an embedding into pores of mesoporous particles or a combination thereof. The modified quantum dot material has a better luminescence lifetime.

Further, the organic material used for coating described above includes poly(methyl methacrylate) (PMMA), polyethylene terephthalate (PET), polyethylene naphthalate (PEN), polystyrene (PS), polyvinylidene difluoride (PVDF), polyvinyl acetate (PVAC), polypropylene (PP), polyamide (PA), polycarbonate (PC), polyimide (PI), epoxy or silicone.

The inorganic material used for coating described above includes nitride, metal oxide, silicon oxide or a combination thereof.

In other embodiments, the luminous core 110 includes a phosphor powder material. For example, the phosphor powder material includes $Y_3Al_5O_{12}$ (YAG), LuYAG, GaYAG, $Ba_2SiO_4$:$Eu^{2+}$, $Sr_2SiO_4$:$Eu^{2+}$, $(Mg,Ca,Sr,Ba)_3Si_2O_7$:$Eu^{2+}$, $Ca_8Mg(SiO_4)_4Cl_2$:$Eu^{2+}$, $(Mg, Ca, Sr, Ba)_2SiO_4$: $Eu^{2+}$, $Sr(LiAl_3N_4)$: $Eu^{2+}$, $Si_{6-n}Al_nO_nN_{8-n}(n=0-4.2)$:$Eu^2$, $SrS$:$Eu^{2+}$, $SrGa_2S_4$:$Eu^{2+}$, $ZnS$:$Cu^+$, $ZnS$:$Ag^+$, $Y_2O_2S$:$Eu^{2+}$, $La_2O_2S$: $Eu^{2+}$, $Gd_2O_2S$:$Eu^{2+}$, $SrGa_2S_4$:$Ce^{3+}$, $ZnS$:$Mn^{2+}$, $SrS$:$Eu^{2+}$, $CaS$: $Eu^{2+}$, $(Sr_{1-x}Ca_x)S$: $Eu^{2+}$, $(Ca, Mg,Y)Si_wAl_xO_yN_z$:$Ce^{2+}$, $Ca_2Si_5N_8$: $Eu^{2+}$, $(Ca, Mg,Y)Si_wAl_xO_yN_z$:$Eu^{2+}$, $(Sr, Ca, Ba)Si_xO_yN_z$:$Eu^{2+}$), $K_2SiF_6$:$Mn^{4+}$, $K_2TiF_6$:$Mn^{4+}$ or $K_2GeF_6$: $Mn^{4+}$.

In some embodiments, in addition to being coated by the first protective layer, a surface of the phosphor powder material may be further treated with other kinds of modification treatments, for example, the surface of the phosphor powder is coated with an organic material, an inorganic material, or the organic material and the inorganic material. As described above, the organic material used for coating includes poly(methyl methacrylate), polyethylene terephthalate, polyethylene naphthalate, polystyrene, polyvinylidene difluoride, polyvinyl acetate, polypropylene, polyamide, polycarbonate, polyimide, epoxy or silicone. The inorganic material used for coating includes nitride, metal oxide, silicon oxide or a combination thereof.

Figure 2:
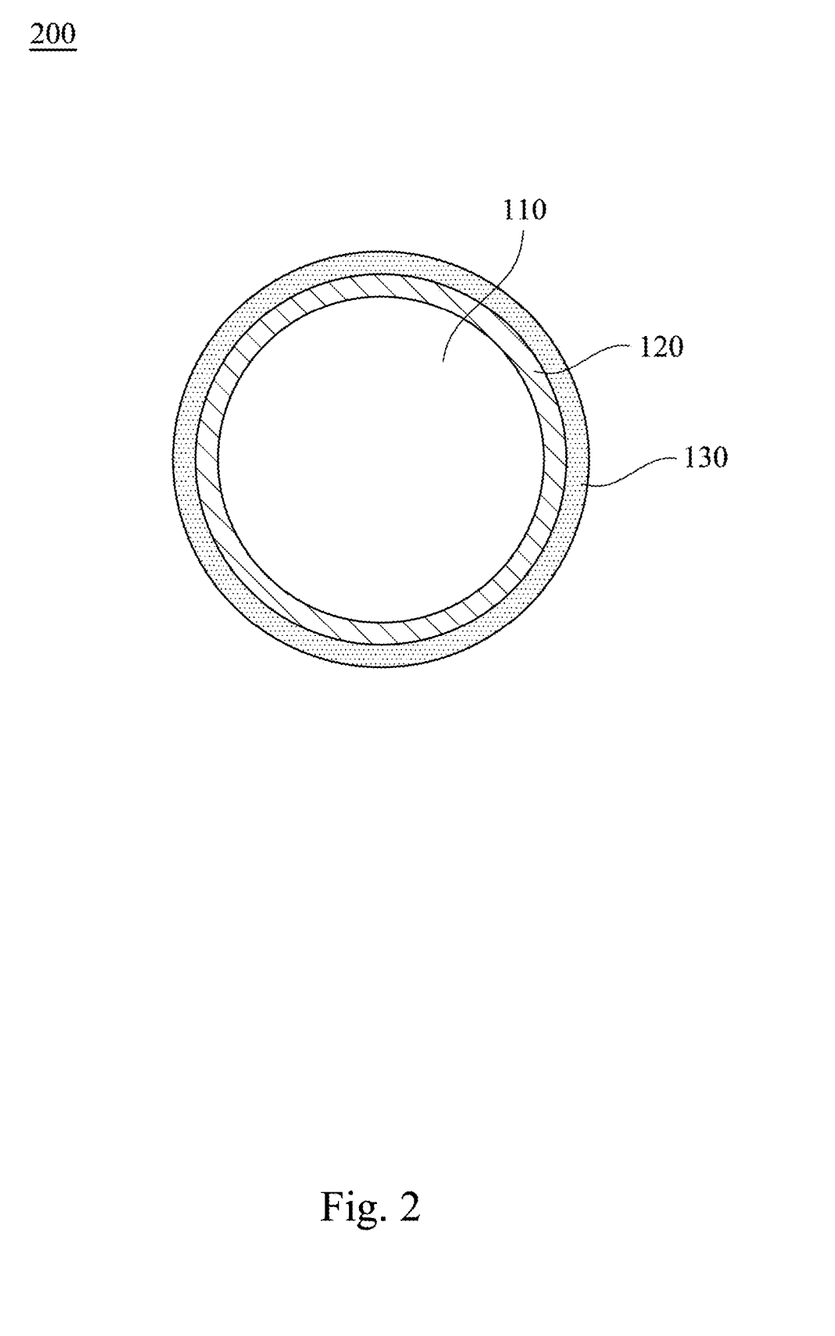
FIG. 2 is a cross-sectional view of a wavelength converting material 200 according to some embodiments of the present disclosure.

Please refer to FIG. 2, which is a cross-sectional view of a wavelength converting material 200 according to some embodiments of the present disclosure. In some embodiments, different from the wavelength converting material 100, the wavelength converting material 200 further includes a second protective layer 130, and the second protective layer 130 covers the first protective layer 120. The second protective layer 130 may include an organic material or an inorganic material, such as poly(methyl methacrylate), polyethylene terephthalate, polyethylene naphthalate, polystyrene, polypropylene, polyamide, polycarbonate, polyimide, epoxy, siloxy resin, $TiO_2$, $SiO_2$, BN or ZnO.

Since the second protective layer 130 may also protect the luminous core 110 and prevent the luminous core 110 from being damaged by external factors (e.g., oxygen or moisture), the wavelength converting material 200 has more excellent luminescence lifetime. As described above, the luminous core 110 may be coated with an organic material or an inorganic material. Therefore, in other embodiments, the configurations of the first protective layer 120 and the second protective layer 130 may be interchanged. That is, the second protective layer 130 covers the luminous core 110, and the first protective layer 120 covers the second protective layer 130.

Figure 3:
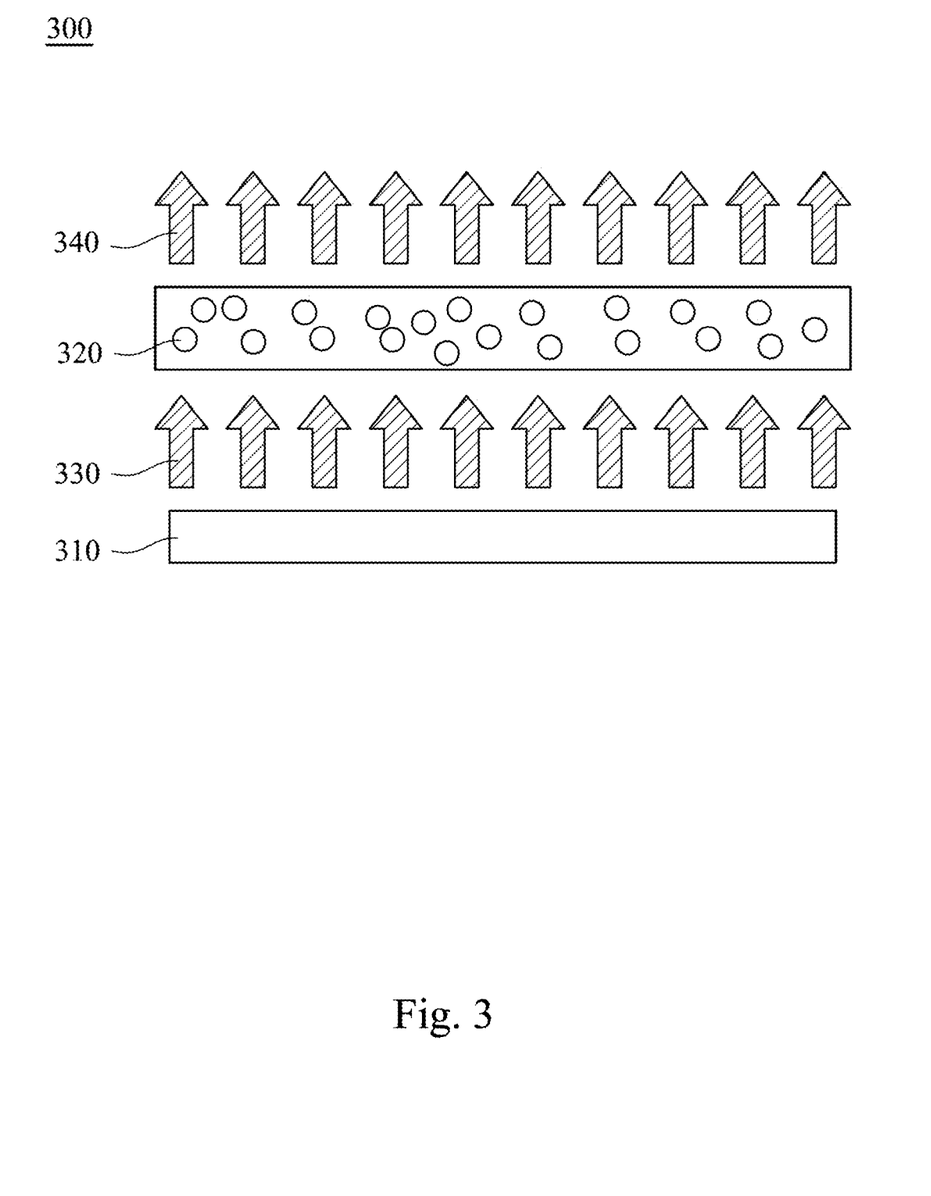
FIG. 3 illustrates a light emitting device 300 according to some embodiments of the present disclosure.

In addition, please refer to FIG. 3, which illustrates a light emitting device 300 according to some embodiments of the present disclosure. The light emitting device 300 includes a solid state semiconductor light emitting element 310 and a wavelength converting material 320. The wavelength converting material 320 may be the above-described wavelength converting material 100 or wavelength converting material 200. The solid state semiconductor light emitting element 310 is configured to emit a first light 330, and the wavelength converting material 320 absorbs a portion of the first light 330 and emits a second light 340 with a wavelength different from a wavelength of the first light 330. In some embodiments, the light emitting device 300 may be a white light device that is applied to illumination or a backlight of the display. In some embodiments, the light emitting device 300 may emit red, blue or green light for use in a variety of fields.

In some embodiments, the solid state semiconductor light emitting element 310 may be an organic light emitting diode, an inorganic light emitting diode, or an organic-inorganic light emitting diode.

The present disclosure also provides some embodiments and comparative embodiments according to the present disclosure. In Embodiment 1, a first protective layer of the present disclosure was used to cover a quantum dot material. In Embodiment 2, a first protective layer of the present disclosure was used to cover a phosphor powder material. In Comparative Embodiment 1, a conventional protective layer was used to cover a quantum dot material. In Comparative Embodiment 2, a quantum dot material did not include a protective layer.

Figure 4:
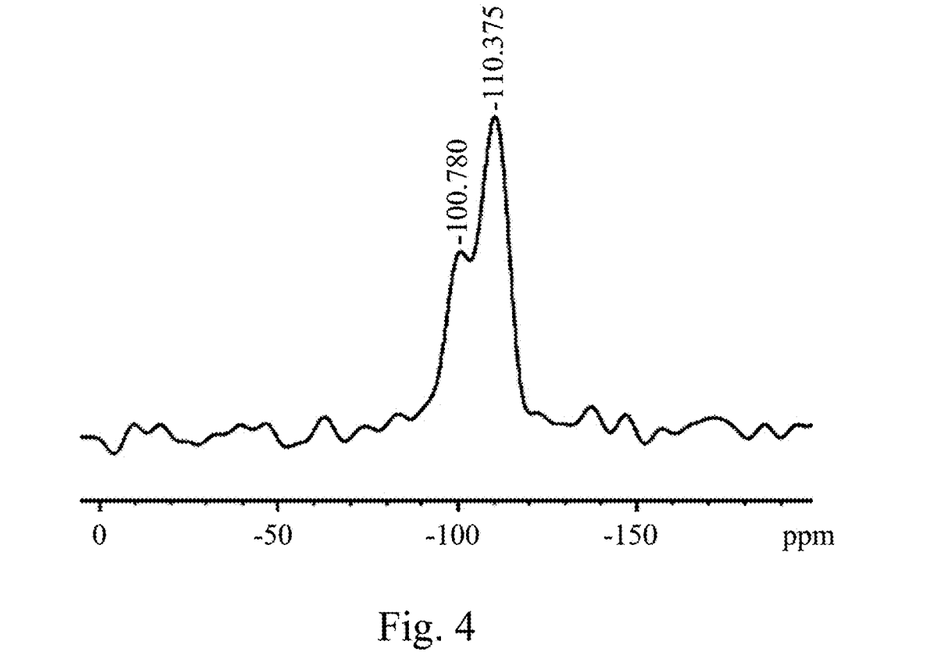
FIG. 4 is a $^{29}$Si nuclear magnetic resonance spectrum of a first protective layer 120 of Embodiment 1 of the present disclosure.

Please refer to FIG. 4, which is a $^{29}Si$ nuclear magnetic resonance spectrum of the first protective layer 120 of Embodiment 1 of the present disclosure. The structure of Embodiment 1 is as shown in FIG. 1, and the first protective layer of the present disclosure was used to cover the quantum dot material.

In the $^{29}Si$ nuclear magnetic resonance spectrum, the chemical shift of the zeroth configuration ($Q^0$) was in a range of from about −73 ppm to about −85 ppm, and the chemical shift of the first configuration ($Q^1$) was in a range of from about −81 ppm to about −90 ppm, and the chemical shift of the second configuration ($Q^2$) was in a range of from about −90 ppm to about −95 ppm, and the chemical shift of the third configuration ($Q^3$) was in a range of from about −98 ppm to about −104 ppm, and the chemical shift of the fourth configuration ($Q^4$) was in a range of from about −108 ppm to about −111 ppm. The above ranges of chemical shifts might include an error of ±3.0 ppm. For example, the chemical shift of the zeroth configuration ($Q^0$) might be in a range of from about −70 ppm to about −88 ppm.

Therefore, as can be seen from FIG. 4, the first protective layer 120 of Embodiment 1 of the present disclosure was mainly composed of the silicon atoms of the third configuration ($Q^3$) and the fourth configuration ($Q^4$). After integrating areas of the ranges corresponding to the configurations respectively, it could be known that a total amount of the silicon atoms of the third configuration ($Q^3$) and the fourth configuration ($Q^4$) of the present disclosure was greater than that of the zeroth configuration ($Q^0$), the first configuration ($Q^1$) and the second configuration ($Q^2$). Moreover, in the $^{29}Si$ nuclear magnetic resonance spectrum, the wavelength converting material of the present disclosure had a peak of the silicon atoms of the third configuration ($Q^3$) in a range of from −95 to −105 ppm and a peak of the silicon atoms of the fourth configuration ($Q^4$) in a range of from −105 to −115 ppm.

Figure 5:
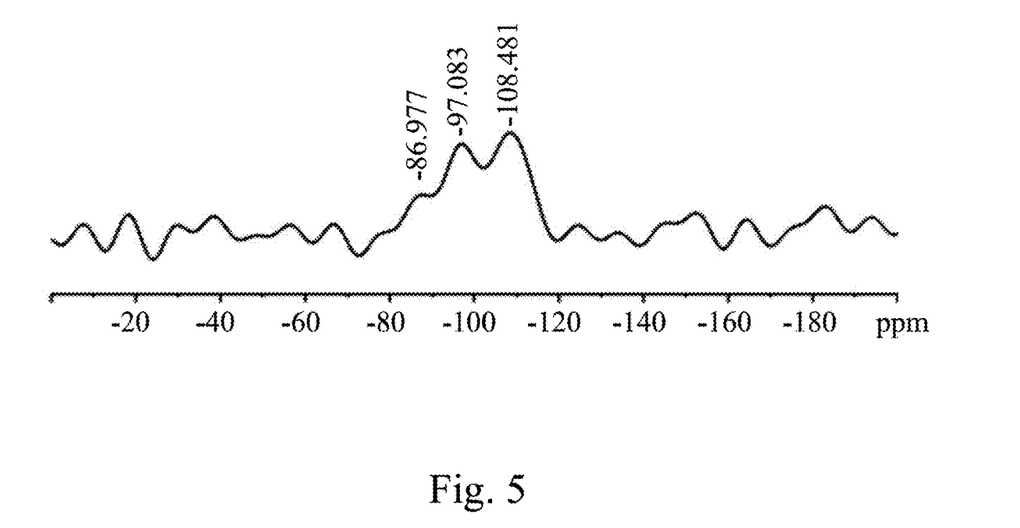
FIG. 5 is a $^{29}$Si nuclear magnetic resonance spectrum of a first protective layer 120 of Embodiment 2 of the present disclosure.

Please refer to FIG. 5, which is a $^{29}Si$ nuclear magnetic resonance spectrum of the first protective layer of Embodiment 2. The structure of Embodiment 2 is as shown in FIG. 1, and the first protective layer of the present disclosure was used to cover the phosphor powder material. It can be seen from FIG. 5 that the first protective layer of Embodiment 2 was also mainly composed of the silicon atoms of the third configuration ($Q^3$) and the fourth configuration ($Q^4$). Therefore, regardless of whether the first protective layer covers the quantum dot material or the phosphor powder material, the total amount of the silicon atoms of the third configuration ($Q^3$) and the fourth configuration ($Q^4$) can be greater than that of the zeroth configuration ($Q^0$), the first configuration ($Q^1$) and the second configuration ($Q^2$). In other words, the first protective layer of the present disclosure can be applied to the quantum dot materials, and can also be applied to the phosphor powder materials.

Figure 6:
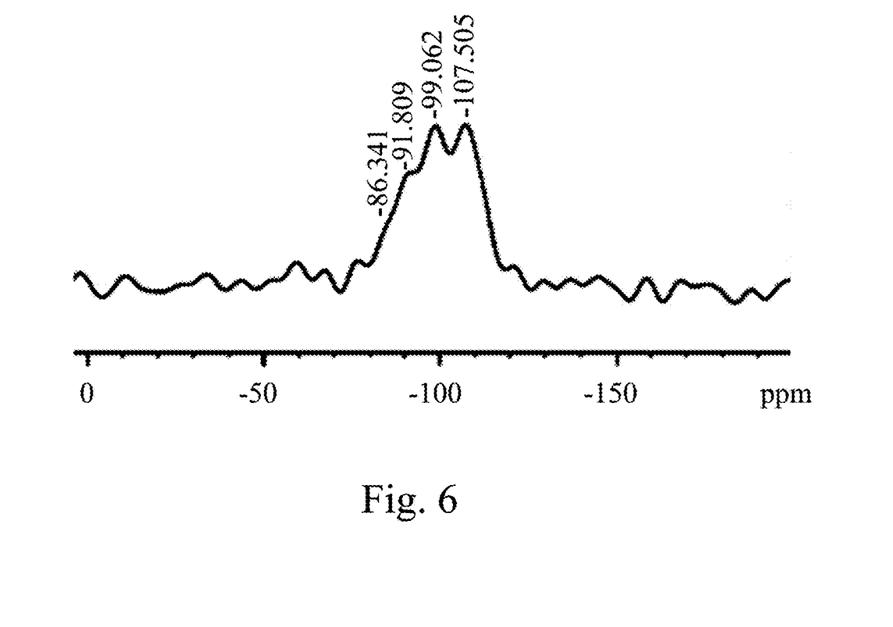
FIG. 6 is a $^{29}$Si nuclear magnetic resonance spectrum of a first protective layer of Comparative Embodiment 1.

Please refer to FIG. 6 which is a $^{29}Si$ nuclear magnetic resonance spectrum of the first protective layer of Comparative Embodiment 1. Amounts of the silicon atoms of the third configuration ($Q^3$) and the fourth configuration ($Q^4$) of the first protective layer of Comparative Embodiment 1 were significantly less. After integrating areas of the ranges corresponding to the configurations respectively, it could be found that a total amount of the silicon atoms of the zeroth configuration ($Q^0$), the first configuration ($Q^1$), and the second configuration ($Q^2$) of Comparative Embodiment 1 was greater than that of the third configuration ($Q^3$) and the fourth configuration ($Q^4$).

Figure 7:
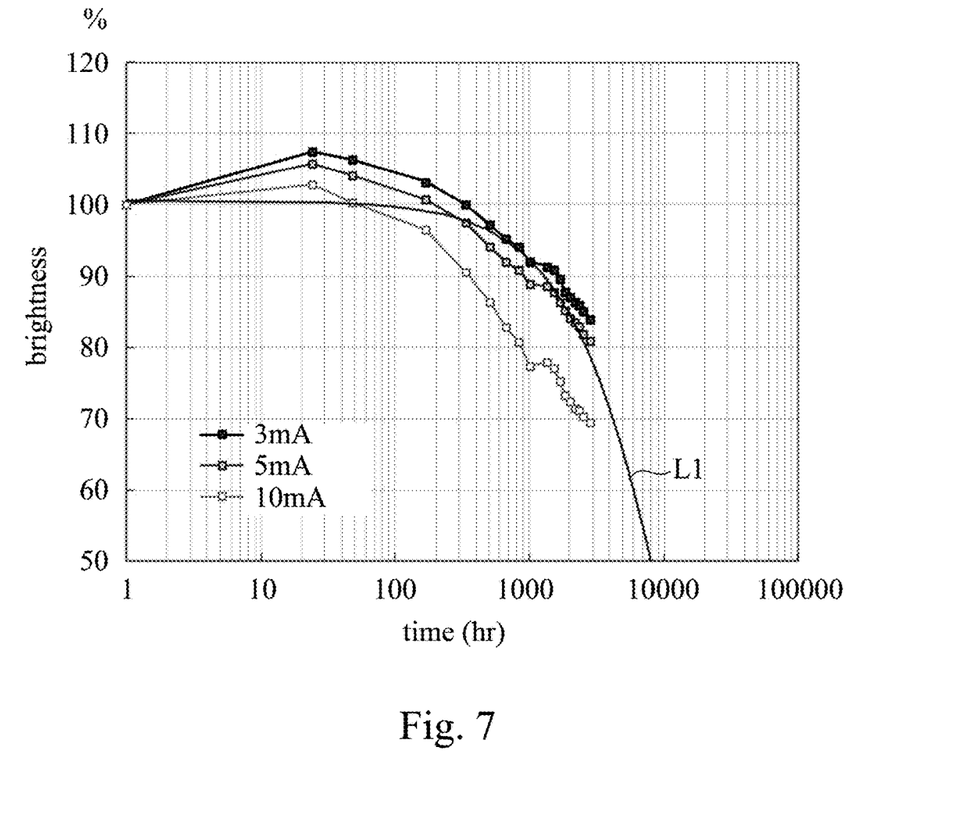
FIG. 7 is a graph showing brightness versus time of Embodiment 1 of the present disclosure.

Next, please refer to FIG. 7, which is a graph showing brightness versus time of Embodiment 1 of the present disclosure. In general, a lifetime of a light emitting element is evaluated by $L_{50}$, which is the time when the brightness of the light emitting element is attenuated to 50% of the original. The degrees of decay of Embodiment 1 at different currents were small, in which when a current was 5 mA, the brightness was maintained at more than about 80% after 3,000 hours. The curve L1 was a trend line of data at the current of 5 mA according to Embodiment 1, and it could be found that L50 of the curve L1 exceeded 8,000 hours.

Figure 8:
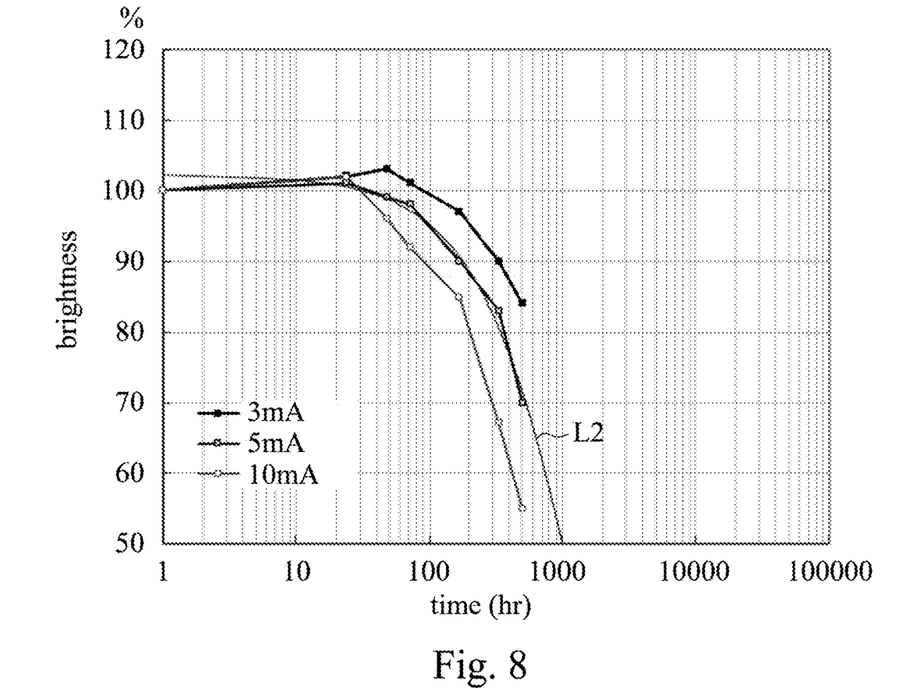
FIG. 8 is a graph showing brightness versus time of Comparative Embodiment 2.

The quantum dot material of Comparative Embodiment 2 did not include a protective layer. Please refer to FIG. 8, which is a graph showing brightness versus time of Comparative Embodiment 2. As can be seen from FIG. 8, although the brightness decayed in the first 50 hours is small, the brightness decayed extremely fast after more than 50 hours. At a current of 5 mA, the brightness after 500 hours was only about 70%. The curve L2 was a trend line of data at the current of 5 mA according to Comparative Embodiment 2, and L50 of the curve L2 was only about 1,000 hours.

In Comparative Embodiment 1, a conventional protective layer was used to cover a quantum dot material. Please refer to FIG. 9, which is a graph showing brightness versus time of Comparative Embodiment 1. Compared with Embodiment 1, it can be found that Comparative Embodiment 1 had large degrees of decay at different currents. In the case of a current of 5 mA, the brightness remained only about 75% after 500 hours. The curve L3 was a trend line of data at the current of 5 mA according to Comparative Embodiment 1, and L50 of the curve L3 was also only about 1,500 hours.

Figure 9:
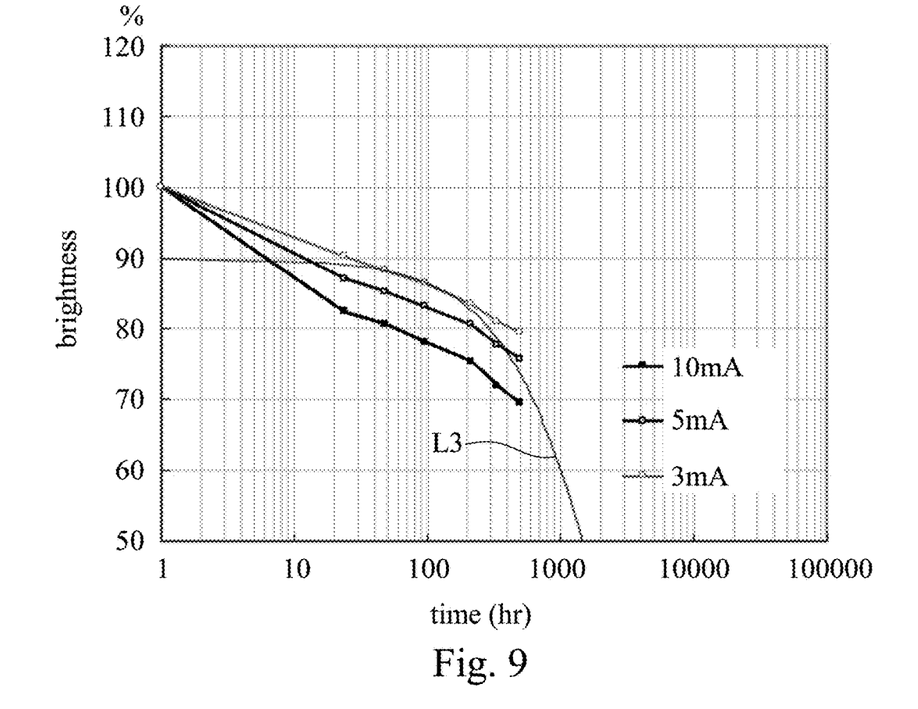
FIG. 9 is a graph showing brightness versus time of Comparative Embodiment 1.

It can be seen from FIGS. 7 and 9 that the use of the first protective layer of the present disclosure can significantly increase the luminescence lifetime of the wavelength converting material. Since the total amount of the silicon atoms of the third configuration ($Q^3$) and the fourth configuration ($Q^4$) of the first protective layer is greater than that of the zeroth configuration ($Q^0$), the first configuration ($Q^1$) and the second configuration ($Q^2$), it can protect the luminous core more effectively and avoid damage from external factors.

Figure 10:
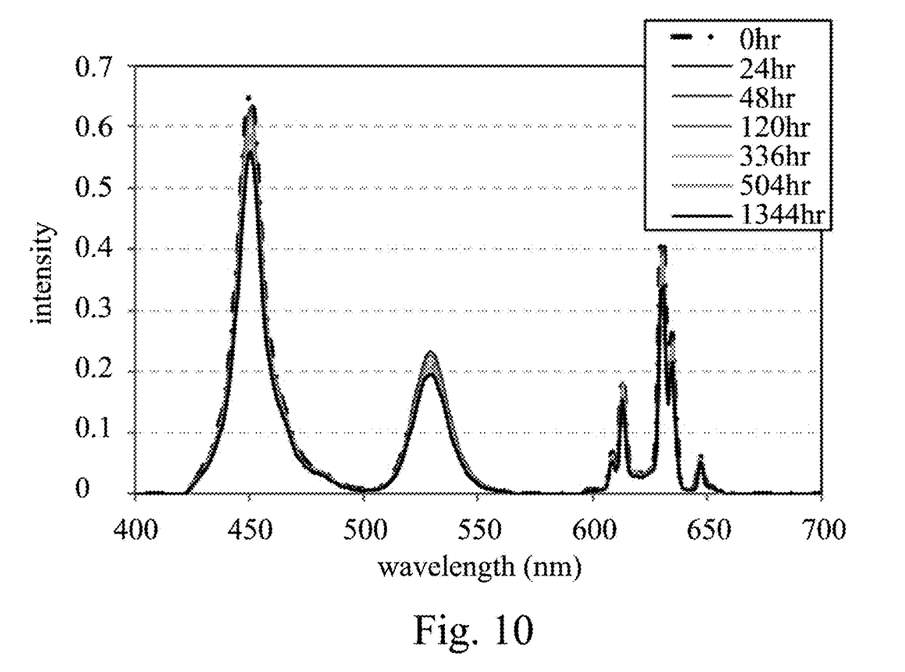
FIG. 10 is a graph showing brightness intensity versus wavelength of a wavelength converting material of Embodiment 1 of the present disclosure.
Figure 11:
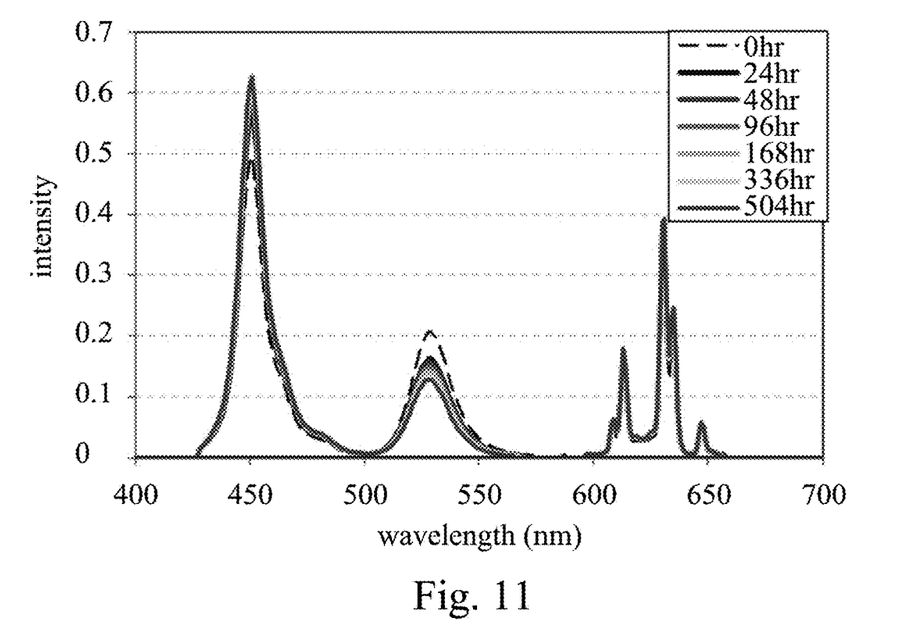
FIG. 11 is a graph showing brightness intensity versus wavelength of a wavelength converting material of Comparative Embodiment 1.

FIG. 10 is a graph showing brightness intensity versus wavelength of the wavelength converting material of Embodiment 1 of the present disclosure. FIG. 11 is a graph showing brightness intensity versus wavelength of the wavelength converting material of Comparative Embodiment 1. Referring to FIG. 10 and FIG. 11 at the same time, it could be found that degree of decay of the brightness intensity of each wavelength range of Embodiment 1 after illuminating for more than 1,300 hours was extremely small, but in Comparative Embodiment 1, after illuminating for 500 hours, degree of decay of the brightness intensity of each wavelength range were large. Specifically, between 500 nm and 550 nm, the degree of decay of the brightness intensity of Comparative Embodiment 1 was large, and the degree of decay of the brightness intensity of Embodiment 1 was relatively small. This result showed that in addition to the increase in the luminescence lifetime of the wavelength converting material, the present disclosure could maintain the color emitted by the wavelength converting material under a long period of operation.

The present disclosure provides the wavelength converting material which can greatly increase the luminescent lifetime of the wavelength converting material. Specifically, the wavelength converting material of the present disclosure has the first protective layer, and the first protective layer has specific configurations of the silicon atoms, so that the protective effect of the first protective layer is more excellent. It is worth noting that the first protective layer of the present disclosure is applicable not only to the quantum dot materials but also to the phosphor powder materials. Further, the present disclosure also provides the light emitting device including the above-described wavelength converting material.

The features of various embodiments or examples are summarized above so that those skilled in the art can better understand the aspects of the present disclosure. Those skilled in the art should appreciate that the present disclosure may be readily utilized as a basis for designing or modifying other processes and structures to achieve the same objectives and/or achieve the same advantages of the embodiments described herein. Those skilled in the art should also appreciate that such equivalent structures do not depart from the spirit and scope of the present disclosure, and various changes, substitutions and alterations herein may be made without departing from the spirit and scope of the present disclosure.

What is claimed is:

1. A wavelength converting material, comprising:
a luminous core; and
a first protective layer covering the luminous core, wherein the first protective layer comprises silicon dioxide, and in a plurality of silicon atoms of the silicon dioxide, each of the silicon atoms is one of a zeroth configuration) ($Q^0$), a first configuration ($Q^1$), a second configuration ($Q^2$), a third configuration ($Q^3$) and a fourth configuration ($Q^4$), and the silicon atom of the zeroth configuration ($Q^0$) does not connect with any siloxy group, and the silicon atom of the first configuration ($Q^1$) connects with one siloxy group, and the silicon atom of the second configuration ($Q^2$) connects with two siloxy groups, and the silicon atom of the third configuration ($Q^3$) connects with three siloxy groups, and the silicon atom of the fourth configuration ($Q^4$) connects with four siloxy groups, wherein a total amount of the silicon atoms of the third configuration ($Q^3$) and the fourth configuration ($Q^4$) is greater than a total amount of the silicon atoms of the zeroth configuration ($Q^0$), the first configuration ($Q^1$) and the second configuration ($Q^2$).

2. The wavelength converting material of claim 1, wherein the total amount of the silicon atoms of the third configuration ($Q^3$) and the fourth configuration ($Q^4$) is greater than 80% based on a total amount of the silicon atoms of the silicon dioxide of 100%.

3. The wavelength converting material of claim 1, wherein in a $^{29}Si$ nuclear magnetic resonance spectrum of the wavelength converting material, there are a peak of the third configuration ($Q^3$) in a range of from −95 to −105 ppm and a peak of the fourth configuration ($Q^4$) in a range of from −105 to −115 ppm.

4. The wavelength converting material of claim 1, wherein the luminous core comprises a quantum dot material.

5. The wavelength converting material of claim 4, wherein a surface of the quantum dot material is subjected to a modification treatment, and the modification treatment comprises a ligand exchange treatment, a microemulsification treatment, an organic material coating, an inorganic material coating, an embedding into pores of mesoporous particles or a combination thereof.

6. The wavelength converting material of claim 5, wherein the organic material used for coating comprises poly(methyl methacrylate) (PMMA), polyethylene terephthalate (PET), polyethylene naphthalate (PEN), polystyrene (PS), polyvinylidene difluoride (PVDF), polyvinyl acetate (PVAC), polypropylene (PP), polyamide (PA), polycarbonate (PC), polyimide (PI), epoxy or silicone.

7. The wavelength converting material of claim 5, wherein the inorganic material used for coating comprises nitride, metal oxide, silicon oxide or a combination thereof.

8. The wavelength converting material of claim 1, wherein the luminous core comprises a phosphor powder material.

9. The wavelength converting material of claim 8, wherein a surface of the phosphor powder material is subjected to a modification treatment, and the modification treatment comprises an organic material coating, an inorganic material coating or a combination thereof.

10. The wavelength converting material of claim 9, wherein the organic material used for coating comprises poly(methyl methacrylate) (PMMA), polyethylene terephthalate (PET), polyethylene naphthalate (PEN), polystyrene (PS), polyvinylidene difluoride (PVDF), polyvinyl acetate (PVAC), polypropylene (PP), polyamide (PA), polycarbonate (PC), polyimide (PI), epoxy or silicone.

11. The wavelength converting material of claim 9, wherein the inorganic material used for coating comprises nitride, metal oxide, silicon oxide or a combination thereof.

12. A light emitting device comprising:
a solid state semiconductor light emitting element configured to emit a first light; and
a wavelength converting material, comprising:
a luminous core; and
a first protective layer covering the luminous core, wherein the first protective layer comprises silicon dioxide, and in a plurality of silicon atoms of the silicon dioxide, each of the silicon atoms is one of a zeroth configuration ($Q^0$), a first configuration ($Q^1$), a second configuration ($Q^2$), a third configuration ($Q^3$) and a fourth configuration ($Q^4$), and the silicon atom of the zeroth configuration ($Q^0$) does not connect with any siloxy group, and the silicon atom of the first configuration ($Q^1$) connects with one siloxy group, and the silicon atom of the second configuration ($Q^2$) connects with two siloxy groups, and the silicon atom of the third configuration ($Q^3$) connects with three siloxy groups, and the silicon atom of the fourth configuration ($Q^4$) connects with four siloxy groups, wherein a total amount of the silicon atoms of the third configuration ($Q^3$) and the fourth configuration ($Q^4$) is greater than a total amount of the silicon atoms of the zeroth configuration ($Q^0$), the first configuration ($Q^1$) and the second configuration ($Q^2$), wherein the wavelength converting material absorbs a portion of the first light and emits a second light with a wavelength different from a wavelength of the first light.

13. The light emitting device of claim 12, wherein the total amount of the silicon atoms of the third configuration ($Q^3$) and the fourth configuration ($Q^4$) is greater than 80% based on a total amount of the silicon atoms of the silicon dioxide of 100%.

14. The light emitting device of claim 12, wherein in a $^{29}$Si nuclear magnetic resonance spectrum of the wavelength converting material, there are a peak of the third configuration ($Q^3$) in a range of from −95 to −105 ppm and a peak of the fourth configuration ($Q^4$) in a range of from −105 to −115 ppm.

15. The light emitting device of claim 12, wherein the luminous core comprises a quantum dot material.

16. The light emitting device of claim 15, wherein a surface of the quantum dot material is subjected to a modification treatment, and the modification treatment comprises a ligand exchange treatment, a microemulsification treatment, an organic material coating, an inorganic material coating, an embedding into pores of mesoporous particles or a combination thereof.

17. The light emitting device of claim 12, wherein the luminous core comprises a phosphor powder material.

18. The light emitting device of claim 17, wherein a surface of the phosphor powder material is subjected to a modification treatment, and the modification treatment comprises an organic material coating, an inorganic material coating or a combination thereof.

19. The light emitting device of claim 18, wherein the organic material used for coating comprises poly(methyl methacrylate) (PMMA), polyethylene terephthalate (PET), polyethylene naphthalate (PEN), polystyrene (PS), polyvinylidene difluoride (PVDF), polyvinyl acetate (PVAC), polypropylene (PP), polyamide (PA), polycarbonate (PC), polyimide (PI), epoxy or silicone.

20. The light emitting device of claim 18, wherein the inorganic material used for coating comprises nitride, metal oxide, silicon oxide or a combination thereof.

* * * * *

UNITED STATES PATENT AND TRADEMARK OFFICE
CERTIFICATE OF CORRECTION

PATENT NO. : 11,355,675 B2
APPLICATION NO. : 16/687634
DATED : June 7, 2022
INVENTOR(S) : Chang-Zhi Zhong et al.

It is certified that error appears in the above-identified patent and that said Letters Patent is hereby corrected as shown below:

On the Title Page

Item (54) and in the Specification, Column 1, Lines 1-2, the Title should read as "WAVELENGTH CONVERTING MATERIAL AND LIGHT EMITTING DEVICE" rather than "WAVELENGTH CONVERTING MATERIAL, AND LIGHT EMITTING DEVICE".

Signed and Sealed this
Twenty-fifth Day of October, 2022

Katherine Kelly Vidal
*Director of the United States Patent and Trademark Office*